(12) United States Patent
Deweerd et al.

(10) Patent No.: US 8,853,049 B2
(45) Date of Patent: *Oct. 7, 2014

(54) SINGLE-SIDED NON-NOBLE METAL ELECTRODE HYBRID MIM STACK FOR DRAM DEVICES

(75) Inventors: Wim Deweerd, San Jose, CA (US); Hanhong Chen, Milpitas, CA (US); Hiroyuki Ode, Higashihiroshima (JP); Xiangxin Rui, Campbell, CA (US)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/238,349

(22) Filed: Sep. 21, 2011

(65) Prior Publication Data
US 2013/0071989 A1  Mar. 21, 2013

(51) Int. Cl.
*H01L 21/20* (2006.01)
*H01L 49/02* (2006.01)
*H01L 27/108* (2006.01)

(52) U.S. Cl.
CPC .......... *H01L 28/40* (2013.01); *H01L 27/1085* (2013.01); *H01L 28/60* (2013.01)
USPC .................................. 438/396; 257/E29.079

(58) Field of Classification Search
USPC .................................. 438/396; 257/E29.079
See application file for complete search history.

(56) References Cited

U.S. PATENT DOCUMENTS

| | | | |
|---|---|---|---|
| 8,574,999 B2 * | 11/2013 | Malhotra et al. | 438/396 |
| 2003/0036239 A1 * | 2/2003 | Lim et al. | 438/381 |
| 2010/0172065 A1 * | 7/2010 | Huang et al. | 361/313 |
| 2010/0302705 A1 * | 12/2010 | Antonov et al. | 361/313 |
| 2011/0204475 A1 * | 8/2011 | Rui et al. | 257/532 |
| 2012/0127629 A1 * | 5/2012 | Roeder et al. | 361/322 |
| 2013/0052792 A1 * | 2/2013 | Malhotra et al. | 438/396 |

FOREIGN PATENT DOCUMENTS

KR  10-2008-0102626  * 11/2008  ............ H01L 27/04

* cited by examiner

*Primary Examiner* — Zandra Smith
*Assistant Examiner* — Jamie C Niesz

(57) ABSTRACT

A method for forming a DRAM MIM capacitor stack having low leakage current and low EOT involves the use of a first electrode that serves as a template for promoting the high k phase of a subsequently deposited first dielectric layer. The first high k dielectric layer comprises a doped material that can be crystallized after a subsequent annealing treatment. An amorphous, doped high k second dielectric material is form on the first dielectric layer. The dopant concentration and the thickness of the second dielectric layer are chosen such that the second dielectric layer remains amorphous after a subsequent annealing treatment. A second electrode layer compatible with the second dielectric layer is formed on the second dielectric layer.

20 Claims, 7 Drawing Sheets

SINGLE-SIDED NON-NOBLE METAL ELECTRODE HYBRID MIM STACK FOR DRAM DEVICES

This application is a continuation-in-part application of U.S. application Ser. No. 13/708,035 filed on Dec. 7, 2012, from which priority is claimed. U.S. application Ser. No. 13/708,035 is a continuation of U.S. application Ser. No. 12/942,238, filed on Nov. 9, 2010 (now issued as U.S. Pat. No. 8,415,657 on Apr. 9, 2013). Furthermore, U.S. application Ser. No. 12/942,238 is a continuation-in-part application of U.S. application Ser. No. 12/708,872, filed on Feb. 19, 2010 (now issued as U.S. Pat. No. 8,318,572 on Nov. 27, 2012).

This document relates to the subject matter of a joint research agreement between Intermolecular, Inc. and Elpida Memory, Inc.

FIELD OF THE INVENTION

The present invention generally relates to the field of dynamic random access memory (DRAM), and more particularly to dielectric material processing for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

One class of high k dielectric materials possessing the characteristics required for implementation in advanced DRAM capacitors are high k metal oxide materials. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), etc. $TiO_2$ and $ZrO_2$ are two specific examples of metal oxide dielectric materials which display significant promise in terms of serving as a high k dielectric material for implementation in DRAM capacitors.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 40. Such materials are generally classified as high k materials. Representative examples of high k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to $SiO_2$ known as the Equivalent Oxide Thickness (EOT). A high k material's EOT is calculated using a normalized measure of silicon dioxide ($SiO_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high k dielectric films in MIM capacitors in order to increase charge storage capacity. The goal is to utilize dielectric materials that exhibit an EOT of less than about 0.8 nm while maintaining a physical thickness of about 5-20 nm.

Generally, as the dielectric constant of a material increases, the band gap of the material decreases. For example. The rutile phase of $TiO_2$ has a k-value of about 80 and a band gap of about 3.0 eV while $ZrO_2$ in the tetragonal phase has a k-value of about 43 and a band gap of about 5.8 eV. The low band gap may lead to high leakage current in the device. As a result, without the utilization of countervailing measures, capacitor stacks implementing high k dielectric materials may experience large leakage currents. High work function electrodes (e.g., electrodes having a work function of greater than 5.0 eV) may be utilized in order to counter the effects of implementing a reduced band gap high k dielectric layer within the DRAM capacitor. Metals, such as platinum, gold, ruthenium, and ruthenium oxide are examples of high work function electrode materials suitable for inhibiting device leakage in a DRAM capacitor having a high k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$ and have higher resistivity than $MoO_2$. For example, $MoO_3$ (the most oxygen-rich phase) has an orthorhombic crystal structure and is a dielectric.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in a reducing atmosphere have been developed that allow crystalline $MoO_2$ to be used as the first electrode (i.e. bottom electrode) in DRAM MIM capacitors with $TiO_2$ or doped-$TiO_2$ high k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. However, these DRAM MIM capacitors have continued to use noble metal (i.e. Ru) materials for the second electrode (i.e. top electrode).

After the formation of the second electrode, the capacitor stack is then subjected to a post metallization anneal (PMA) treatment. The PMA treatment serves to crystallize the second electrode and to anneal defects in the dielectric and interface states that are formed at the dielectric/second electrode interface during the deposition. Also, if there is no post dielectric anneal (PDA) treatment done before metallization, the PMA treatment can serve to crystallize the dielectric layer to improve the k value and fill oxygen vacancies. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference. As discussed above, $MoO_2$ is sensitive to oxidation to form oxygen-rich compounds that negatively impacts its performance as an electrode material. The reducing atmosphere anneal processes discussed previously with respect to the use of crystalline $MoO_2$ as a first electrode are not an option at this stage of the device manufacture because they would degrade the performance of the dielectric layer through the formation of oxygen vacancies. $TiO_2$ high k dielectric materials are especially sensitive to processing conditions and increases in the leakage current are observed, likely due to the formation of oxygen vacancies.

At some DRAM device nodes, TiN may be used as the first electrode. TiN may be used with $ZrO_2$ dielectric layers because the high k tetragonal phase of $ZrO_2$ forms easily on TiN. The oxygen moiety within the $ZrO_2$ layer is reasonably stable and the concentration of oxygen vacancies is low. This contributes to the low leakage current observed for $ZrO_2$ dielectric layers. However, since the k-value is lower than desired (k<~43), the EOT is too large for next generation DRAM technologies. As an example, $ZrO_2$ MIM capacitors can have leakage currents in the range of about $8 \times 10^{-8}$ $A/cm^2$ at an EOT of about 0.70 nm to about $1.5 \times 10^{-8}$ $A/cm^2$ at an EOT of about 0.85 nm. The EOT target for next generation DRAM technologies is less than about 0.60 nm. In the case of $ZrO_2$ dielectric layers, TiN is typically used as the second electrode as well.

As discussed previously, the rutile phase of $TiO_2$ is an attractive candidate high k dielectric material with a k-value in excess of about 80 depending on processing conditions. The high k-value should allow the formation of MIM capacitor stacks with low EOT values within the physical thickness constraints of advanced DRAM technologies. The use of crystalline $MoO_2$ would be attractive as a first electrode since it would serve as a good template to promote the formation of the rutile phase of $TiO_2$. Ideally, the crystalline $MoO_2$ would be used as the second electrode as well to form a symmetric MIM stack. However, currently Ru is used for the second electrode due to integration issues surrounding the use of $MoO_2$ as the second electrode. As discussed previously, both $MoO_2$ and $TiO_2$ are very sensitive to the environment used during the various annealing steps. The oxidation of $MoO_2$ to $MoO_{2+x}$ and the loss of oxygen in $TiO_2$ to form oxygen vacancies both contribute to the higher leakage current observed in MIM stacks using these materials. As an example, $TiO_2$ MIM capacitors can have leakage currents in the range of about $8 \times 10^{-6}$ $A/cm^2$ at an EOT of about 0.38 nm to about $1.0 \times 10^{-7}$ $A/cm^2$ at an EOT of about 0.50 nm.

Therefore, there is a need to develop methods for forming capacitor stacks that combine the low leakage current and simple integration processes of $ZrO_2$ based dielectric layers with the high k and low EOT benefits of $TiO_2$ based dielectric layers.

SUMMARY OF THE DISCLOSURE

In some embodiments of the present invention, a crystalline $MoO_2$ first electrode is used to promote the formation of the rutile phase of a $TiO_2$ dielectric layer that is subsequently formed. The $MoO_2$ first electrode may be annealed to increase the crystallinity and to reduce unwanted $MoO_{2+x}$ phases that may be present. The $TiO_2$ dielectric layer may be doped to reduce the leakage current. The $TiO_2$ dielectric layer may be annealed to increase the crystallinity and to reduce the concentration of oxygen vacancies that may be present. An amorphous $ZrO_2$ dielectric layer is formed on top of the $TiO_2$ dielectric layer. The amorphous $ZrO_2$ dielectric layer reduces the leakage current of the capacitor stack. A TiN second electrode is formed on top of the amorphous $ZrO_2$ dielectric layer. The TiN second electrode is compatible with the amorphous $ZrO_2$ dielectric layer and is easy to integrate into current DRAM manufacturing process flows.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
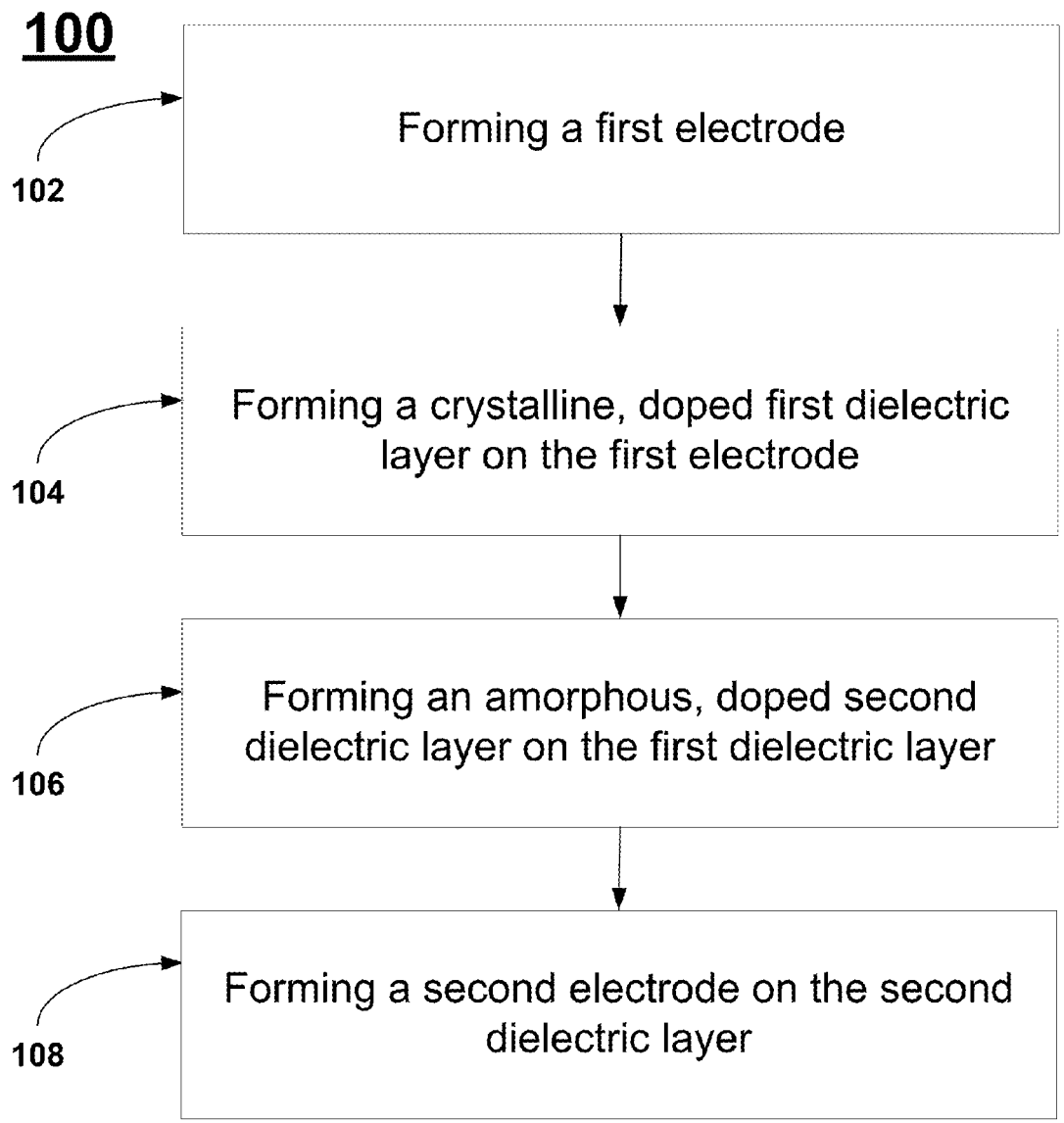
FIG. 1 illustrates a flow chart illustrating a method for fabricating a DRAM capacitor stack in accordance with some embodiments of the present invention.

FIG. 1 describes a method, 100, for fabricating a DRAM capacitor stack. The initial step, 102, comprises forming a first electrode layer on a substrate. Examples of suitable electrode materials comprise metals, metal alloys, conductive metal oxides, conductive metal silicides, conductive metal nitrides, or combinations thereof. A particularly interesting class of materials is the conductive metal oxides. Optionally, the first electrode layer can then be subjected to an annealing process (not shown). The next step, 104, comprises forming a crystalline, doped first dielectric material on the first electrode layer. Optionally, the first dielectric layer can then be subjected to an annealing process (not shown). The next step, 106, comprises forming an amorphous, doped second dielectric layer on the first dielectric layer. The next step, 108, comprises forming a second electrode on the second dielectric layer.

Those skilled in the art will appreciate that each of the first electrode layer, the first and second dielectric layers, and the second electrode used in the DRAM MIM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

In FIGS. 2-5 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 2:
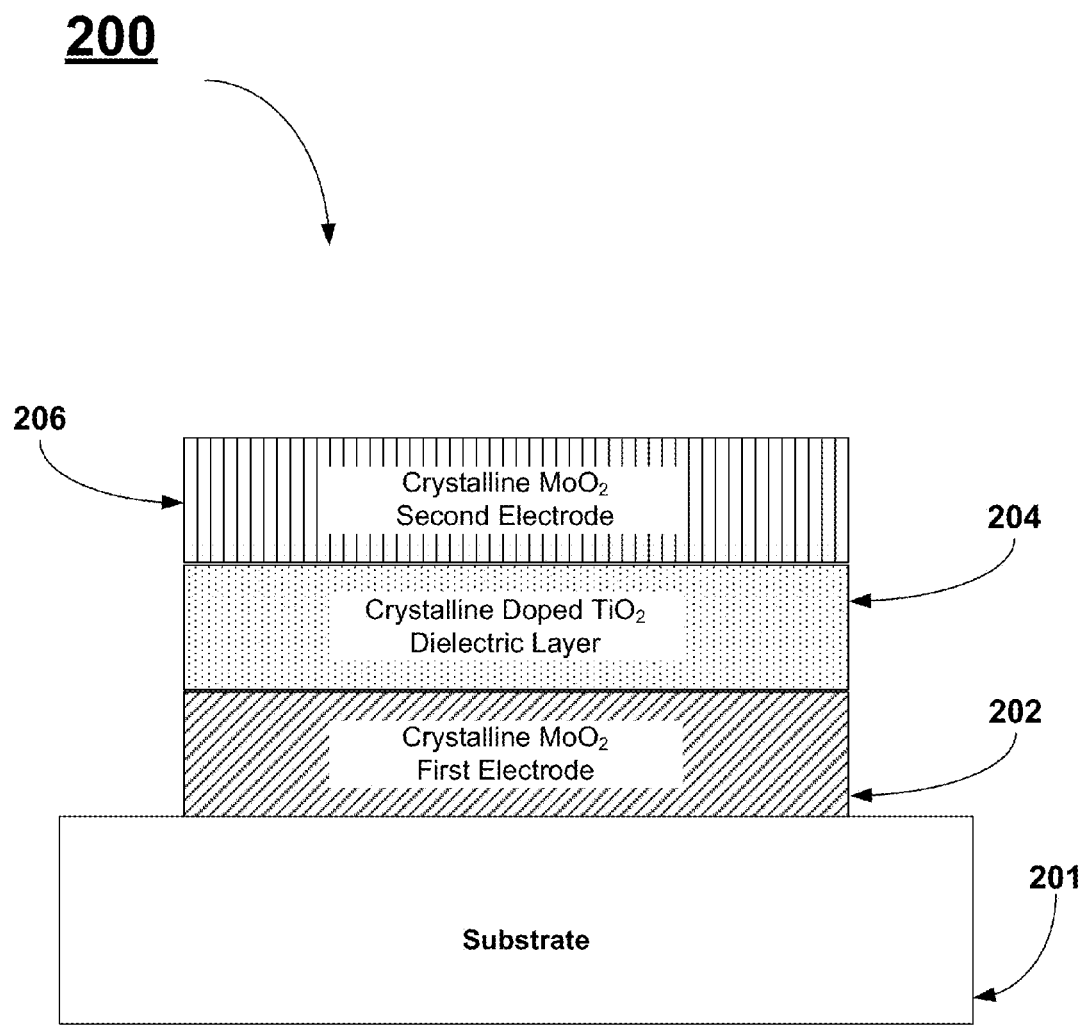
FIG. 2 illustrates a simplified cross-sectional view of a DRAM capacitor stack fabricated in accordance with some embodiments of the present invention.

FIG. 2 illustrates a simple capacitor stack, 200, consistent with a DRAM MIM capacitor stack comprising crystalline metal oxide electrode layers and a doped high k dielectric layer. First electrode layer, 202, is formed on substrate, 201. Generally, the substrate has already received several processing steps in the manufacture of a full DRAM device. First electrode layer, 202, comprises one of metals, metal alloys, conductive metal oxides, conductive metal nitrides, conductive metal silicides, or combinations thereof, etc. For this example, first electrode layer, 202, comprises a conductive metal oxide that may serve to promote the rutile phase of $TiO_2$. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. A specific electrode material of interest is the crystalline $MoO_2$ compound of molybdenum dioxide.

Optionally, first electrode, 202, can be annealed to crystallize the material. In the case of crystalline $MoO_2$, it is advantageous to anneal the first electrode in a reducing atmosphere such as Ar, $N_2$, or forming gas to prevent the formation of oxygen-rich compounds. Examples of such an annealing process is further described in U.S. application Ser. No. 13/084, 666 filed on Apr. 12, 2011, entitled "METHOD FOR FABRICATING A DRAM CAPACITOR" and is incorporated herein by reference.

In one example of a DRAM MIM capacitor stack comprising crystalline metal oxide electrode layers and a doped high k dielectric layer, a first electrode comprising between about 5 nm and about 10 nm of molybdenum oxide is formed on a substrate. The molybdenum oxide electrode material is formed at a process temperature between about 125 C and 400 C using an ALD process technology. Optionally, the substrate with the first electrode is then annealed in a reducing atmosphere comprising between about 1% and about 20% $H_2$ in $N_2$ and advantageously between about 5% and about 10% $H_2$ in $N_2$ between 400 and 520 C for between about 1 millisecond and about 60 minutes as discussed previously.

In the next step, dielectric layer, 204, would then be formed on the annealed first electrode layer, 202. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), or doped versions of the same. These dielectric materials may be formed as a single layer or may be formed as a hybrid or nanolaminate structure. Typically, dielectric layer, 204, is subjected to a PDA treatment before the formation of the second electrode as discussed previously. A specific dielectric material of interest is $TiO_2$ doped with one of Al, Zr, Ge, Hf, Sn, Sr, Y, Si, La, Er, Ga, Gd, Mg, Co, or combinations thereof. A specific dielectric material of interest is $TiO_2$ doped with $Al_2O_3$ to between about 5 atomic % and about 15 atomic % Al.

In a specific example, the dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with Al at a concentration between about 5 atomic % and about 15 atomic % Al. The $TiO_2$ dielectric layer is formed at a process temperature between about 200 C and 350 C using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes.

In the next step, the second electrode, 206, is formed on dielectric layer, 204. The second electrode may be a one of, metals, metal alloys, conductive metal oxides, conductive metal nitrides, conductive metal silicides, or combinations thereof, etc. In this example, the second electrode is a conductive metal oxide, and more specifically, crystalline $MoO_2$.

In one example of the present invention, the second electrode comprising between about 0.1 nm and about 100 nm of molybdenum oxide is formed on the $TiO_2$ dielectric layer. The crystalline $MoO_2$ electrode material is formed at a process temperature between about 125 C and 400 C using an ALD process technology. The capacitor stack, 200, is then subjected to a PMA treatment as discussed earlier. However, as mentioned previously, DRAM MIM capacitors with this configuration exhibit high leakage current.

Figure 3:
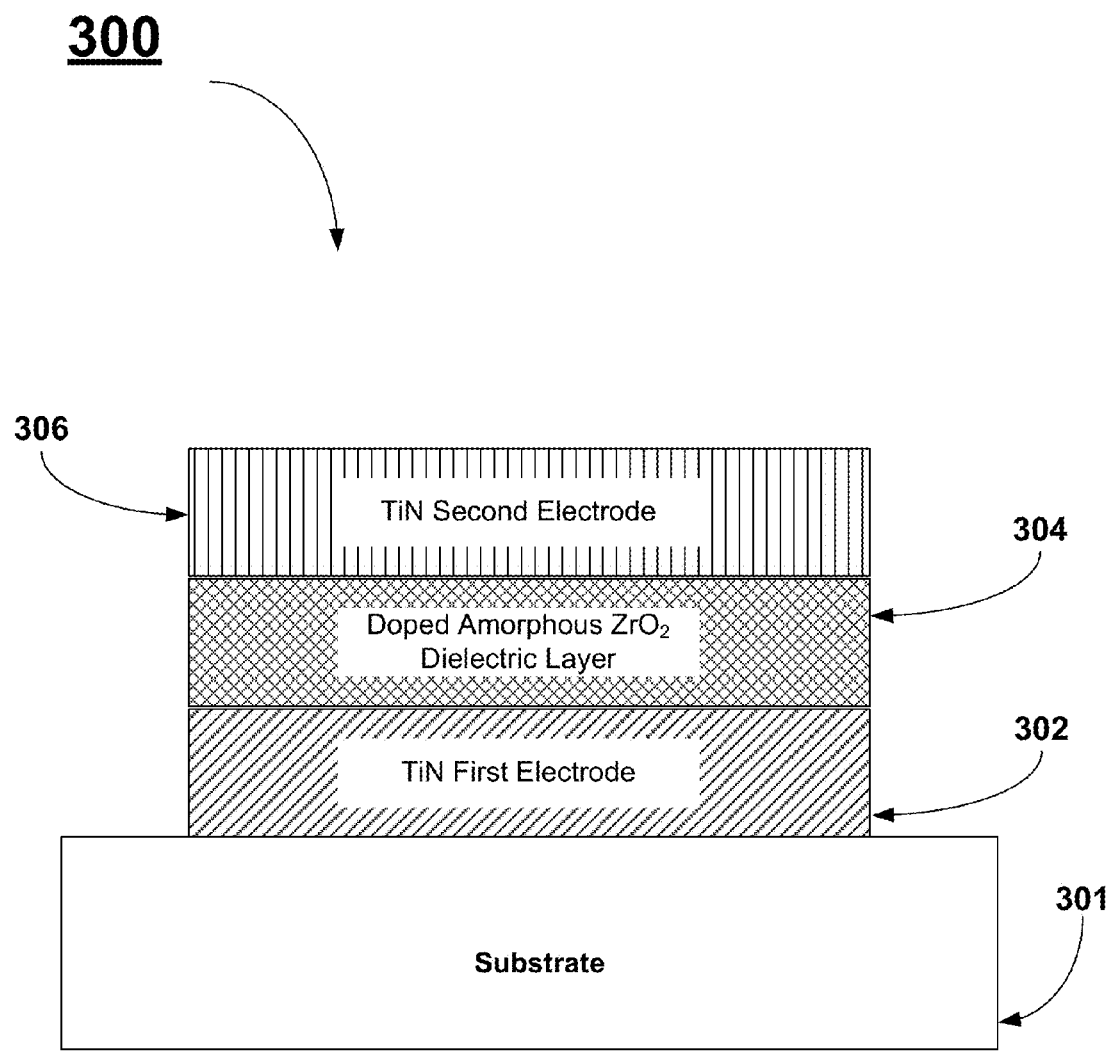
FIG. 3 illustrates a simplified cross-sectional view of a DRAM capacitor stack fabricated in accordance with some embodiments of the present invention.

FIG. 3 illustrates a simplified cross-sectional view of a DRAM capacitor stack fabricated in accordance with some embodiments of the present invention. This example will use $ZrO_2$ as the dielectric material. However, those skilled in the art will understand that the present methods may be applied to many dielectric materials. First electrode, 302, is formed on substrate, 201. When $ZrO_2$ is used as the dielectric material, the first electrode is advantageously TiN. The TiN first electrode may optionally receive a treatment before the formation of the multi-layer dielectric material. If the first electrode layer is TiN or another conductive metal nitride material, then the first electrode layer may be annealed using a Rapid Thermal Anneal (RTA) technique or furnace anneal technique. For the RTA case, the temperature is quickly raised in the presence of a nitrogen containing gas such as $N_2$, forming gas, $NH_3$, etc. Examples of such electrode treatment steps are further described in U.S. application Ser. No. 13/051,531 filed on Mar. 18, 2011, which is incorporated herein by reference. A doped $ZrO_2$ layer, 304, is then formed on top of the TiN first electrode. Suitable dopants for use with $ZrO_2$ dielectric materials comprise Al, Ge, Hf, Sn, Sr, Y, Si, Ti, La, Er, Ga, Gd, Mg, Co, or combinations thereof. The dopant concentration is selected such that the $ZrO_2$ layer remains amorphous after subsequent annealing treatments. The dielectric layer may receive a PDA treatment as discussed previously. Second electrode, 306, is then formed on top of the multi-layer dielectric material. Examples of suitable materials for the second electrode layer comprise Ru, TiN, Pt, Ir, Pd, Ni, Co, NiN, WN, VN, NiO, $RuO_2$, CoN, MoN, or combinations thereof. When $ZrO_2$ is used as the dielectric material, the second electrode is advantageously TiN. The capacitor stack may receive a PMA treatment as discussed previously. DRAM MIM capacitors with this configuration will exhibit low leakage current but will also exhibit high EOT values due to the relatively low k value of $ZrO_2$.

Figure 4:
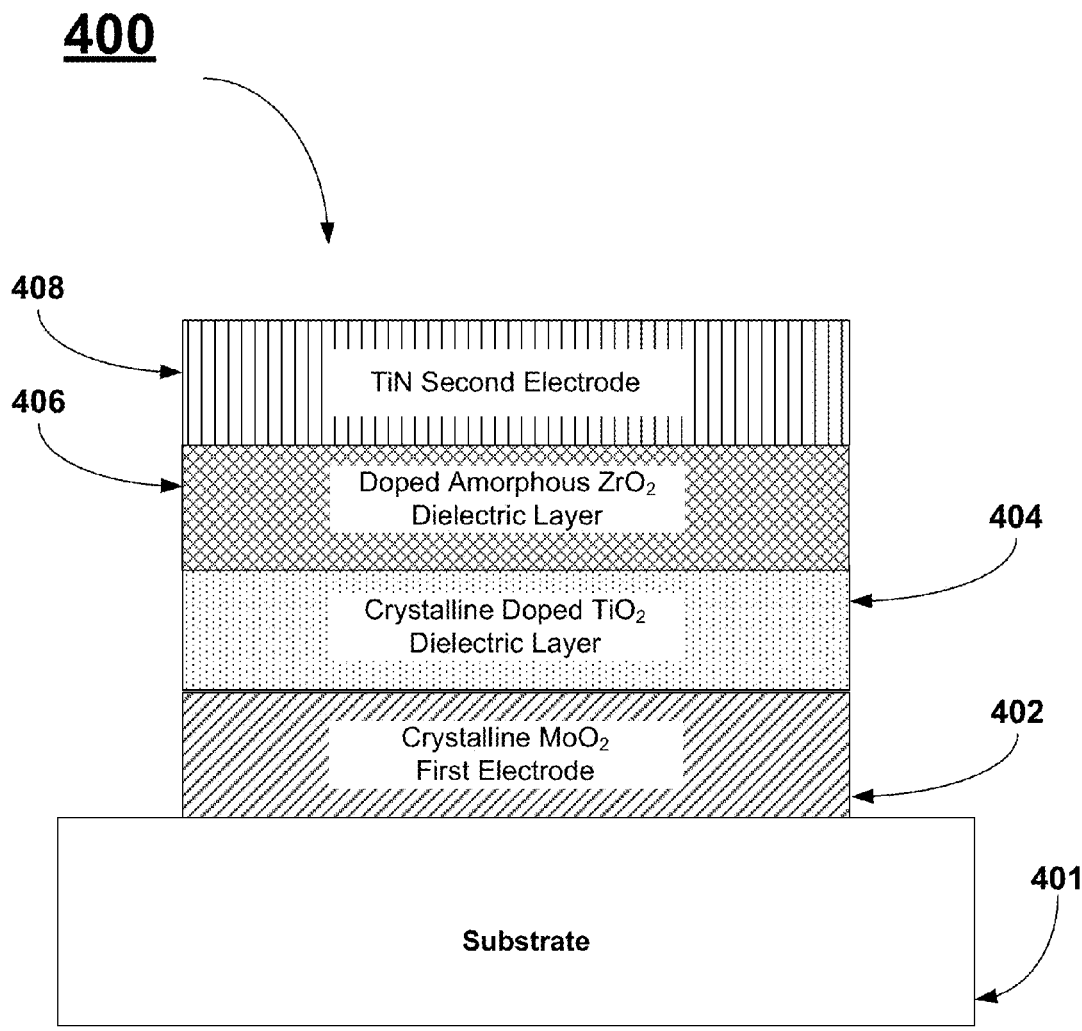
FIG. 4 illustrates a simplified cross-sectional view of a DRAM capacitor stack fabricated in accordance with some embodiments of the present invention.

FIG. 4 illustrates a simple capacitor stack, 400, consistent with a DRAM MIM capacitor stack according to some embodiments of the present invention comprising a crystalline metal oxide first electrode layer, a crystalline, doped high k first dielectric layer, an amorphous, doped high k second dielectric layer, and a metal nitride second electrode layer. First electrode layer, 402, is formed on substrate, 401. Generally, the substrate has already received several processing steps in the manufacture of a full DRAM device. First electrode layer, 402, comprises one of metals, metal alloys, conductive metal oxides, conductive metal nitrides, conductive metal silicides, or combinations thereof, etc. For this example, first electrode layer, 402, comprises a conductive metal oxide that may serve to promote the rutile phase of $TiO_2$. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. A specific electrode material of interest is the crystalline $MoO_2$ compound of molybdenum dioxide. Optionally, first electrode, 402, can be annealed to crystallize the material as discussed previously.

In the next step, crystalline, doped first dielectric layer, 404, would then be formed on the annealed first electrode layer, 402. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), or doped versions of the same. These dielectric materials may be formed as a single layer or may be formed as a hybrid or nanolaminate structure. A specific dielectric material of interest is $TiO_2$ doped with one of Al, Zr, Ge, Hf, Sn, Sr, Y, Si, La, Er, Ga, Gd, Mg, Co, or combinations thereof. A specific dielectric material of interest is $TiO_2$ doped with $Al_2O_3$ to between about 5 atomic % and about 15 atomic % Al.

In a specific example, the crystalline, doped first dielectric layer comprises between about 6 nm to about 10 nm of $TiO_2$ wherein at least 30% of the $TiO_2$ is present in the rutile phase. Generally, the $TiO_2$ first dielectric layer may either be a single film or may comprise a nanolaminate. Advantageously, the $TiO_2$ material is doped with Al at a concentration between about 5 atomic % and about 15 atomic % Al. The $TiO_2$ first dielectric layer is formed at a process temperature between about 200 C and 350 C using an ALD process technology.

In the next step, amorphous, doped second dielectric layer, 406, would then be formed on the crystalline, doped first dielectric layer, 404. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), or doped versions of the same. These dielectric materials may be formed as a single layer or may be formed as a hybrid or nanolaminate structure. Suitable dopants for use with $ZrO_2$ dielectric materials comprise Al, Ge, Hf, Sn, Sr, Y, Si, Ti, La, Er, Ga, Gd, Mg, Co, or combinations thereof. The dopant concentration is selected such that the $ZrO_2$ layer remains amorphous after subsequent annealing treatments. A specific dielectric material of interest is $ZrO_2$ doped with $Al_2O_3$. The $ZrO_2$ layer needs to be thick enough that it forms a continuous layer. Therefore, the minimum thickness is about 0.5 nm.

Additionally, the $ZrO_2$ layer should be thin enough that it remains amorphous after subsequent annealing treatments. Therefore, the maximum thickness is about 2.0 nm. Advantageously, the thickness of the $ZrO_2$ layer is in the range from about 0.7 nm to about 1.5 nm. The thickness of the $ZrO_2$ layer is typically less than or equal to 25% of the total dielectric thickness of the DRAM MIM capacitor (i.e. the total thickness of the combination of the crystalline, doped high k first dielectric layer and the amorphous, doped high k second dielectric layer).

The substrate with the first electrode, a crystalline, doped high k first dielectric layer, and an amorphous, doped high k second dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes.

Second electrode is then formed on top of the multi-layer dielectric material. Examples of suitable materials for the second electrode layer comprise Ru, TiN, Pt, Ir, Pd, Ni, Co, NiN, WN, VN, NiO, $RuO_2$, CoN, MoN, or combinations thereof. When $ZrO_2$ is used as the dielectric material, the second electrode is advantageously TiN. The capacitor stack may receive a PMA treatment as discussed previously.

DRAM MIM capacitors with the configuration illustrated in FIG. 4 will exhibit low leakage current due to the current blocking properties of the amorphous, doped high k second dielectric layer. Additionally, the DRAM MIM capacitor will exhibit low EOT values due to the high k value of the crystalline, doped high k first dielectric layer. A further benefit of the DRAM MIM capacitor stack illustrated in FIG. 4 is that it is easy to integrate into existing DRAM manufacturing process flows. The use, treatment, materials compatibility, reliability, etc. of TiN second electrodes are well established. Therefore, the DRAM MIM capacitor stack illustrated in FIG. 4 represents an opportunity to integrate the benefits of the $MoO_2$ first electrode and the high k properties of doped $TiO_2$ into the DRAM MIM manufacturing process without having to adapt to the use of new material as a second electrode.

Figure 5:
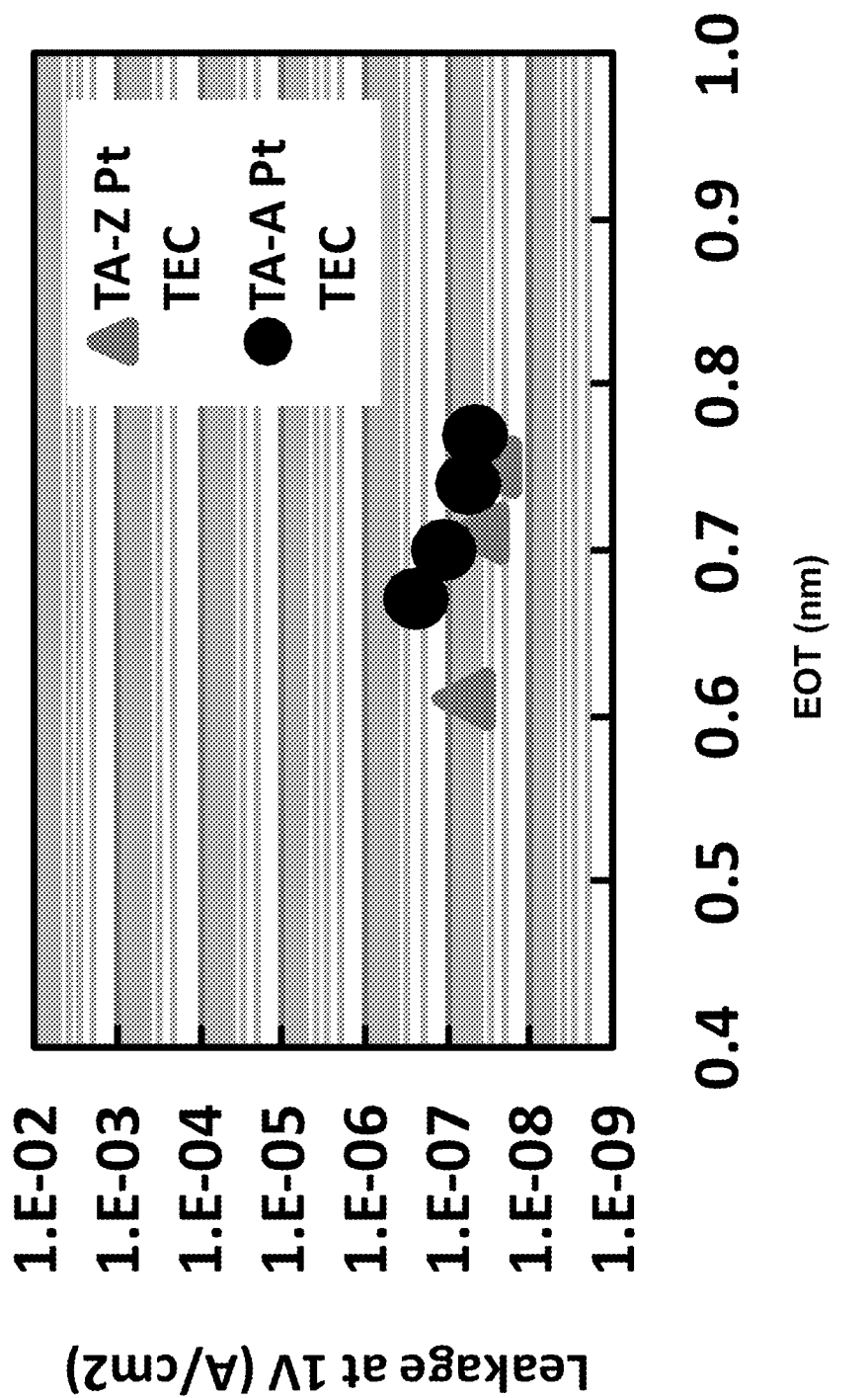
FIG. 5 presents data for leakage current at 1V versus EOT.

The benefits of some embodiments of the present invention are illustrated in the data presented in FIG. 5. A first group of simple capacitor stacks were formed comprising a $MoO_2$ first electrode, an Al-doped $TiO_2$ dielectric layer, and a Pt second electrode. These samples are denoted TA-A Pt TEC in the legend and illustrated by the black circles in FIG. 5. A second group of simple capacitor stacks were formed comprising a $MoO_2$ first electrode, an Al-doped $TiO_2$ first dielectric layer, a doped amorphous $ZrO_2$ second dielectric layer, and a Pt second electrode. These samples are denoted TA-Z Pt TEC in the legend and illustrated by the gray triangles in FIG. 5. As illustrated in FIG. 5, The TA-Z Pt TEC samples exhibited lower leakage current than the TA-A Pt TEC samples at a given EOT thickness. Additionally, the TA-Z Pt TEC samples exhibited a lower EOT for an equivalent level of leakage current.

Figure 6:
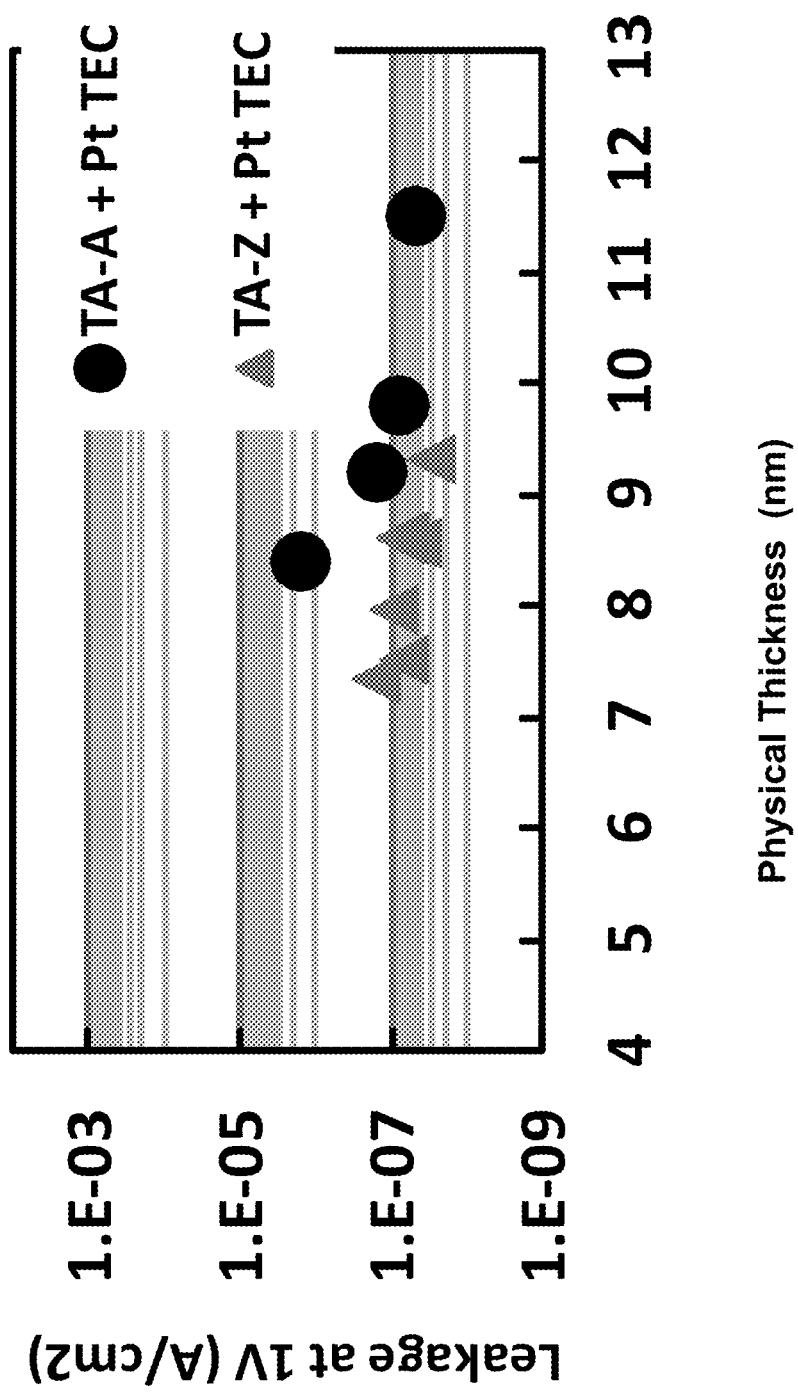
FIG. 6 presents data for leakage current at 1V versus Physical Thickness.

The benefits of some embodiments of the present invention are illustrated in the data presented in FIG. 6. A first group of simple capacitor stacks were formed comprising a $MoO_2$ first electrode, an Al-doped $TiO_2$ dielectric layer, and a Pt second electrode. These samples are denoted TA-A Pt TEC in the legend and illustrated by the black circles in FIG. 6. A second group of simple capacitor stacks were formed comprising a $MoO_2$ first electrode, an Al-doped $TiO_2$ first dielectric layer, a doped amorphous $ZrO_2$ second dielectric layer, and a Pt second electrode. These samples are denoted TA-Z Pt TEC in the legend and illustrated by the gray triangles in FIG. 6. As illustrated in FIG. 6, The TA-Z Pt TEC samples exhibited lower leakage current than the TA-A Pt TEC samples at a given physical thickness.

Figure 7:
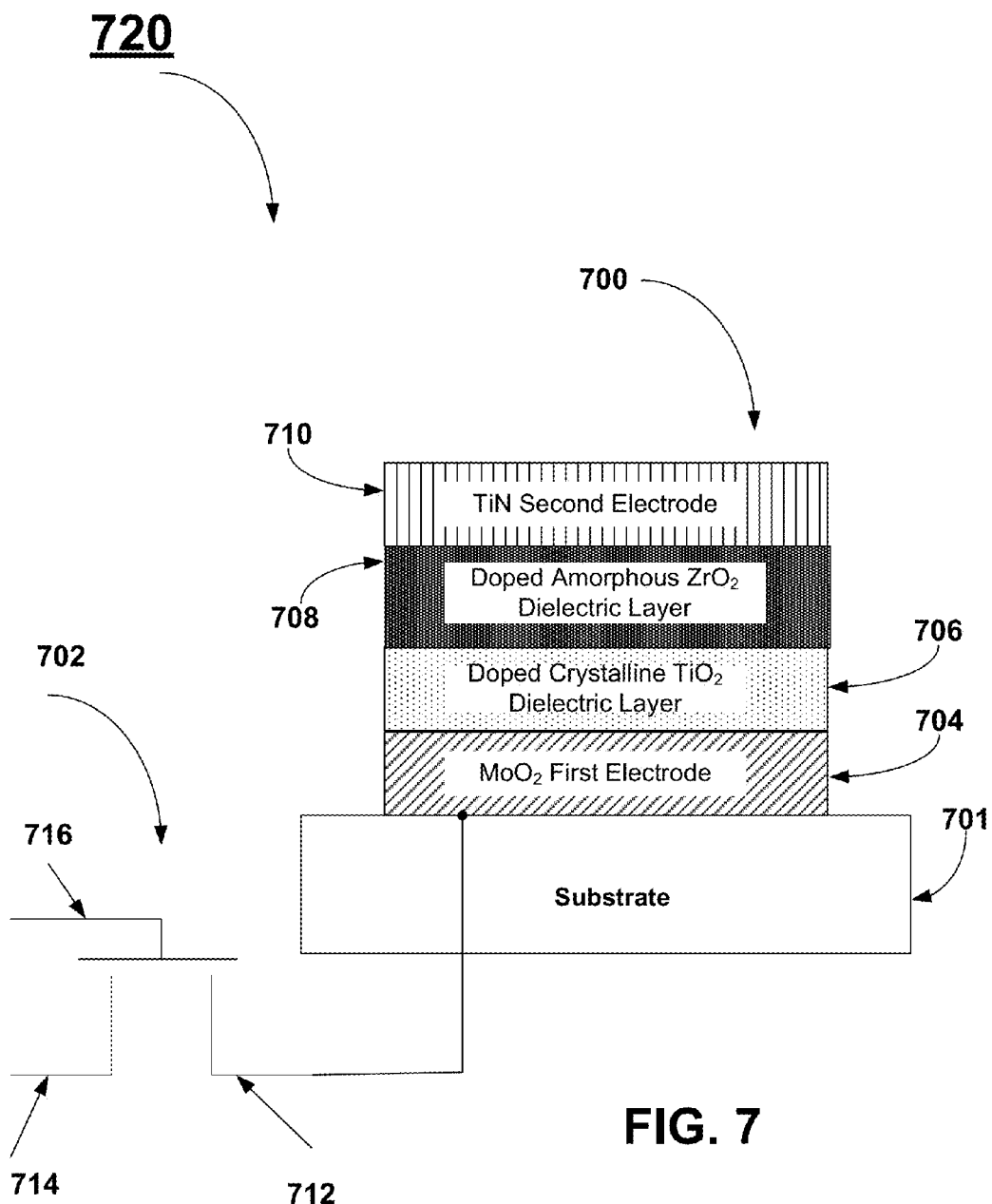
FIG. 7 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 7 is used to illustrate one DRAM cell, 720, manufactured using a bilayer dielectric structure as discussed previously. The cell, 720, is illustrated schematically to include two principle components, a cell capacitor, 700, and a cell transistor, 702. The cell transistor is usually constituted by a MOS transistor having a gate, 716, source, 712, and drain, 714. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 700, comprises a first electrode, 704, formed on substrate, 701. The first electrode, 704, is connected to the source or drain of the cell transistor, 702. For illustrative purposes, the first electrode has been connected to the source, 712, in this example. As discussed previously, first electrode, 704, may be subjected to an anneal in a reducing atmosphere before the formation of the dielectric layer if the first electrode is a conductive metal oxide such as $MoO_2$. Crystalline, doped high k first dielectric layer, 706, is formed on top of the first electrode. If the crystalline, doped high k first dielectric layer is $TiO_2$, then the first dielectric layer will be lightly or non-doped so that the rutile phase of $TiO_2$ can be formed on the bottom electrode. Amorphous, doped high k second dielectric layer, 708, is formed on top of the first dielectric layer. As discussed previously, the second dielectric layer may be doped. If the second dielectric layer is $ZrO_2$, then the second dielectric layer will be highly doped so that it will remain amorphous (<30% crystalline) after subsequent anneal steps. Typically, the bilayer dielectric material is then subjected to a PDA treatment. The second electrode layer, 710, is then formed on top of the bilayer dielectric material. When the second dielectric layer is $ZrO_2$, the second electrode is typically TiN. This completes the formation of the capacitor stack. Typically, the capacitor stack is then subjected to a PMA treatment.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
forming a first electrode layer on a substrate,
wherein the first electrode comprises molybdenum oxide;
forming a first dielectric material on the first electrode layer,
wherein the first dielectric material comprises a first dopant;
forming a second dielectric material on the first dielectric material,
wherein the second dielectric material comprises a second dopant,
wherein at least one of the first dielectric material or the second dielectric material has a nanolaminate structure, and
wherein the second dielectric material is a different material from the first dielectric material;
forming a second electrode layer on the second dielectric material; and
performing an annealing step
wherein more than 30% of the first dielectric material is present in a rutile phase after the annealing step, and
wherein the second dielectric material is less than 30% crystalline after the annealing step.

2. The method of claim 1 wherein the first dielectric material comprises one of $SiO_2$, a bilayer of $SiO_2$ and SixNy, SiON, $Al_2O_3$, $HfO_2$, HfSiOx, $ZrO_2$, $Ta_2O_5$, $TiO_2$, $Nb_2O_5$, $SrTiO_3$ (STO), BaSrTiOx (BST), or PbZrTiOx (PZT).

3. The method of claim 2 wherein the first dielectric material comprises $TiO_2$, and wherein the first dopant comprises one of Al, Zr, Ge, Hf, Sn, Sr, Y, Si, La, Er, Ga, Gd, Mg, Co, or combinations thereof.

4. The method of claim 1 wherein the second dielectric material comprises one of $SiO_2$, a bilayer of $SiO_2$ and SixNy, SiON, $Al_2O_3$, $HfO_2$, HfSiOx, $ZrO_2$, $Ta_2O_5$, $TiO_2$, $Nb_2O_5$, $SrTiO_3$ (STO), BaSrTiOx (BST), or PbZrTiOx (PZT).

5. The method of claim 4 wherein the second dielectric material comprises $ZrO_2$, and wherein the second dopant comprises one of Al, Ge, Hf, Sn, Sr, Y, Si, Ti, La, Er, Ga, Gd, Mg, Co, or combinations thereof.

6. The method of claim 1 wherein the second dielectric material is thinner than the first dielectric material.

7. The method of claim 1 wherein the second electrode layer comprises one of Ru, TiN, Pt, Ir, Pd, Ni, Co, NiN, WN, VN, NiO, $RuO_2$, CoN, MoN, or combinations thereof.

8. The method of claim 7 wherein the second electrode layer comprises TiN.

9. The method of claim 1 wherein the first electrode layer is subjected to an annealing treatment before the formation of the first dielectric material.

10. The method of claim 1 wherein the first electrode layer, first dielectric material, and second dielectric material are subjected to an annealing treatment after the formation of the second dielectric material and before the formation of the second electrode layer.

11. The method of claim 1 wherein the first electrode layer, first dielectric material, second dielectric material and second electrode layer are subjected to an annealing treatment after the formation of the second electrode layer.

12. The method of claim 1 wherein the first dielectric material comprises $TiO_2$, and wherein the first dopant comprises $Al_2O_3$.

13. The method of claim 12 wherein a concentration of the first dopant in the first dielectric material is between 5 atomic % and about 15 atomic % Al.

14. The method of claim 12 wherein the first dielectric material comprises nanolaminate.

15. The method of claim 12 wherein the first dielectric material is formed using a temperature of between about 200 C and 350 C.

16. The method of claim 15 wherein the first dielectric material is formed using atomic layer deposition.

17. A method for forming a capacitor stack comprising:
forming a $MoO_2$ first electrode layer on a substrate;
forming a $TiO_2$ dielectric layer on the $MoO_2$ first electrode layer
wherein the $TiO_2$ dielectric layer comprises a first dopant, and
wherein more than 30% material of the $TiO_2$ dielectric layer is present in a rutile phase after a subsequent annealing treatment;
forming a $ZrO_2$ dielectric layer on the $TiO_2$ dielectric layer,
wherein the $ZrO_2$ dielectric layer comprises a second dopant,
wherein at least one of the $TiO_7$ dielectric layer or the $ZrO_2$ dielectric layer has a nanolaminate structure, and
wherein material of the $ZrO_2$ dielectric layer is amorphous after a subsequent annealing treatment; and
forming a TiN second electrode layer on the $ZrO_2$ dielectric layer.

18. The method of claim 17 further comprising annealing the $MoO_2$ first electrode layer before the forming of the $TiO_2$ dielectric layer.

19. The method of claim 17 further comprising annealing the $MoO_2$ first electrode layer, the $TiO_2$ dielectric layer, and the $ZrO_2$ dielectric layer after the formation of the $ZrO_2$ dielectric layer and before the forming of the TiN second electrode layer.

20. The method of claim 17 wherein the $MoO_2$ first electrode layer, the $TiO_2$ dielectric layer, the $ZrO_2$ dielectric layer, material and the TiN second electrode layer are subjected to an annealing treatment after the formation of the TiN second electrode layer.

* * * * *